US009263972B2

United States Patent
Yokoyama

(10) Patent No.: US 9,263,972 B2
(45) Date of Patent: Feb. 16, 2016

(54) VIBRATOR, VIBRATION TYPE DRIVING APPARATUS AND MANUFACTURING METHOD OF VIBRATOR

(71) Applicant: CANON KABUSHIKI KAISHA, Tokyo (JP)

(72) Inventor: Daisuke Yokoyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 225 days.

(21) Appl. No.: 13/862,772

(22) Filed: Apr. 15, 2013

(65) Prior Publication Data

US 2013/0278112 A1 Oct. 24, 2013

(30) Foreign Application Priority Data

Apr. 19, 2012 (JP) .................. 2012-095705

(51) Int. Cl.
*H02N 2/02* (2006.01)
*H02N 2/00* (2006.01)
*H02N 2/10* (2006.01)

(52) U.S. Cl.
CPC ............. *H02N 2/001* (2013.01); *H02N 2/0015* (2013.01); *H02N 2/0065* (2013.01); *H02N 2/026* (2013.01); *H02N 2/103* (2013.01); *H02N 2/22* (2013.01); *Y10T 29/42* (2015.01)

(58) Field of Classification Search
CPC ..... H02N 2/0005; H02N 2/001; H02N 2/003; H02N 2/004; H02N 2/0065; H02N 2/02; H02N 2/026; H02N 2/04; H02N 2/10; H02N 2/103; H02N 2/12

USPC ......................... 310/323.01–323.21
See application file for complete search history.

(56) References Cited

U.S. PATENT DOCUMENTS

| 7,642,696 | B2 | 1/2010 | Mukae | |
| 7,701,115 | B2 | 4/2010 | Higashionji et al. | |
| 7,898,146 | B2 | 3/2011 | Higashionji et al. | |
| 2008/0272672 | A1 | 11/2008 | Higashionji et al. | |
| 2009/0015099 | A1 | 1/2009 | Mukae | |
| 2009/0230818 | A1* | 9/2009 | Mukae et al. | 310/323.16 |
| 2010/0066205 | A1 | 3/2010 | Higashionji et al. | |
| 2010/0181870 | A1* | 7/2010 | Nagaoka et al. | 310/323.16 |

FOREIGN PATENT DOCUMENTS

| JP | 8-251953 A | 9/1996 |
| JP | 9-322568 A | 12/1997 |
| JP | 2002-165470 A | 6/2002 |
| JP | 2004-304887 A | 10/2004 |
| JP | 2009-5560 A | 1/2009 |
| JP | 2010-268564 A | 11/2010 |

* cited by examiner

*Primary Examiner* — Derek Rosenau
(74) *Attorney, Agent, or Firm* — Fitzpatrick, Cella, Harper & Scinto

(57) ABSTRACT

A vibrator includes an elastic body bonded to an electrical-mechanical energy converting element and including at least two contact parts, in which the at least two contact parts have convex shapes, shapes of surfaces of the at least two contact parts are part of spherical shapes, and rising directions of the at least two contact parts toward a member to be driven when the member is driven are different.

8 Claims, 13 Drawing Sheets

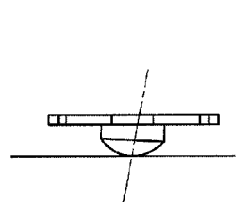
FIG. 9A
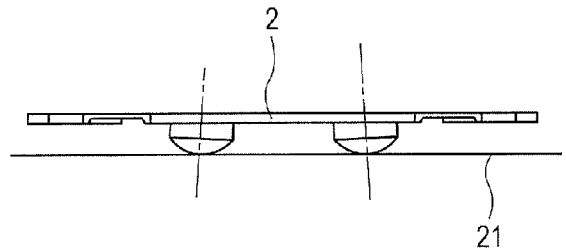
FIG. 9B
FIG. 10
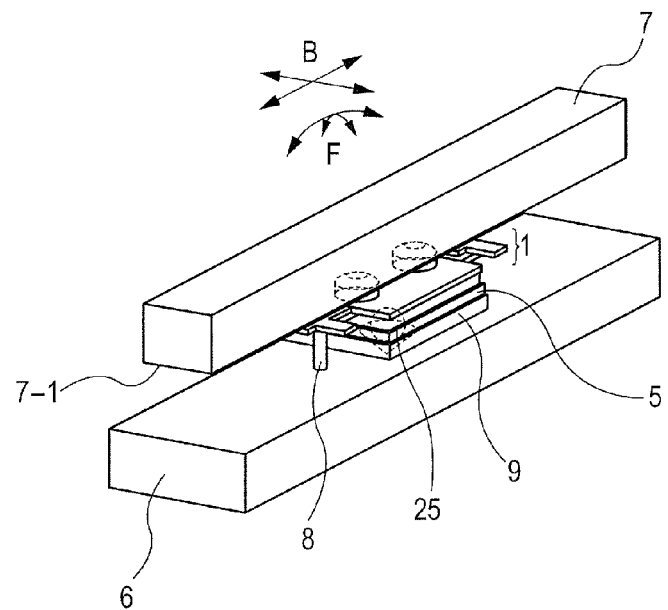

VIBRATOR, VIBRATION TYPE DRIVING APPARATUS AND MANUFACTURING METHOD OF VIBRATOR

BACKGROUND OF THE INVENTION

1. Field of the Invention

The present invention relates to a vibrator, a vibration type driving apparatus and a manufacturing method of the vibrator.

2. Description of the Related Art

Conventionally, a vibration type driving apparatus (for example, ultrasonic motor) that drives a moving body by vibration generated by an elastic body is known.

In the vibration type driving apparatus, a vibrator that includes an electrical-mechanical energy converting element (for example, piezoelectric element) and an elastic body (elastic body mainly made of metal) bonded with the electrical-mechanical energy converting element excites a plurality of vibration modes.

The plurality of vibrations are combined to generate an elliptical motion on a surface of the elastic body, and a member to be driven that is in contact with the elastic body is relatively driven.

Various forms of the vibration type driving apparatus are proposed. For example, in relation to a vibration wave motor that rotates and drives a lens barrel of a camera, a ring-shaped vibration wave motor and a rod-shaped rotary vibration wave motor are proposed.

A large number of devised motor configurations and forms are further proposed, such as a vibration wave motor formed as a rotary actuator including a plurality of plate-shaped elastic bodies on the circumference, in which a vibrating part is formed by a thin plate part and a projection part.

A large number of linear type vibration wave motors are also proposed, in which the plate type elastic bodies come into contact with a linear slider to linearly drive the elastic bodies.

A vibration type driving apparatus disclosed in Japanese Patent Application Laid-Open No. 2004-304887 will be illustrated as an example to describe a summary of a configuration of the vibration wave motor including the plate type elastic body.

The vibration type driving apparatus includes a vibrator and a slider that comes into contact with the vibrator.

The vibrator is formed by bonding an electrical-mechanical energy converting element (for example, piezoelectric element) to a plate type elastic body including a flat-plate vibrating body provided with two projection parts on one of the surfaces.

If AC electric fields at different phases are applied to the piezoelectric element, two out-of-plane bending vibrations are excited in the vibrator, and an elliptical motion is generated at tips of the two projection parts.

As a result, the slider that comes into contact with the projection parts receives frictional driving force and is driven in one direction.

SUMMARY OF THE INVENTION

However, if there are processing accuracy variations in the dimension of the projection parts in the elastic body of the vibration type driving apparatus, contact areas and contact directions of the plurality of projection part tips relative to the moving body vary in the driving apparatus, and the driving performance is adversely affected.

Therefore, highly accurate processing is necessary to arrange a plurality of projection part contact surfaces on the same plane and to equalize areas of the projection part contact surfaces. This causes an increase in the cost.

When post-processing is applied to the tips of the projection parts based on a method, such as lap processing and grinding processing, for highly accurate finish as illustrated in FIG. 19, the plurality of projection part contact surfaces can be relatively easily processed on the same plane in terms of the flatness.

However, to equalize the areas of the post-processed projection part contact surfaces, lapping is performed through a state illustrated in FIG. 20, i.e., a state in which lapping of one of the projection parts is completed, but lapping of the other projection part is not completed. Therefore, one of the projection parts needs to be lapped more than necessary, and more lap time is required accordingly. This causes an increase in the cost.

An aspect of the present invention relates to a vibrator, a vibration type driving apparatus or a manufacturing method of the vibrator that can improve driving performance by equalizing contact areas relative to a moving body, without the necessity to highly accurately process projection parts in the vibrator.

An aspect of the present invention relates to a vibrator including an elastic body bonded to an electrical-mechanical energy converting element and including at least two contact parts, in which the at least two contact parts have convex shapes, shapes of surfaces of the at least two contact parts are part of spherical shapes, and rising directions of the at least two contact parts toward a member to be driven when the member is driven are different.

An aspect of the present invention relates to a vibrator including: an electrical-mechanical energy converting element; and an elastic body bonded to the electrical-mechanical energy converting element and including contact parts, wherein each of the parts has convex shape in which part of spherical shape has been removed.

An aspect of the present invention relates to a vibration type driving apparatus including: the vibrator described above; an attachment base member that supports the vibrator; and an equalize member arranged between the vibrator and the attachment base member.

An aspect of the present invention relates to a manufacturing method of a vibrator, the manufacturing method including processing a tip of a contact part arranged on an elastic body of the vibrator by lapping or grinding processing so that part of the tip has a plane shape in part of a spherical shape.

An aspect of the present invention relates to a manufacturing method of a vibrator, the manufacturing method including processing a tip of a first contact part arranged on an elastic body and a tip of a second contact part arranged on the elastic body by lapping or grinding processing so that each of the tip of the first contact part and the tip of the second contact part has plane shape in part of spherical shape.

Further features of the present invention will become apparent from the following description of exemplary embodiments with reference to the attached drawings.

BRIEF DESCRIPTION OF THE DRAWINGS

FIG. 9A is an exploded left view of the elastic body of FIG. 8.

FIG. 9B is an exploded front view of the elastic body of FIG. 8.

FIG. 10 is a diagram illustrating a configuration of main parts of the vibration type driving apparatus.

DESCRIPTION OF THE EMBODIMENTS

Preferred embodiments of the present invention will now be described in detail in accordance with the accompanying drawings.

First Embodiment

A configuration example of a vibrator of a vibration type driving apparatus according to the present invention will be described in a first embodiment with reference to FIGS. 1A to 6.

The vibration type driving apparatus of the present embodiment is bonded to an electrical-mechanical energy converting element and includes an elastic body with one or more contact parts. The contact parts of the elastic body are brought into frictional contact with a member to be driven, and vibration generated by the elastic body relatively moves the member to be driven.

Figure 1A:
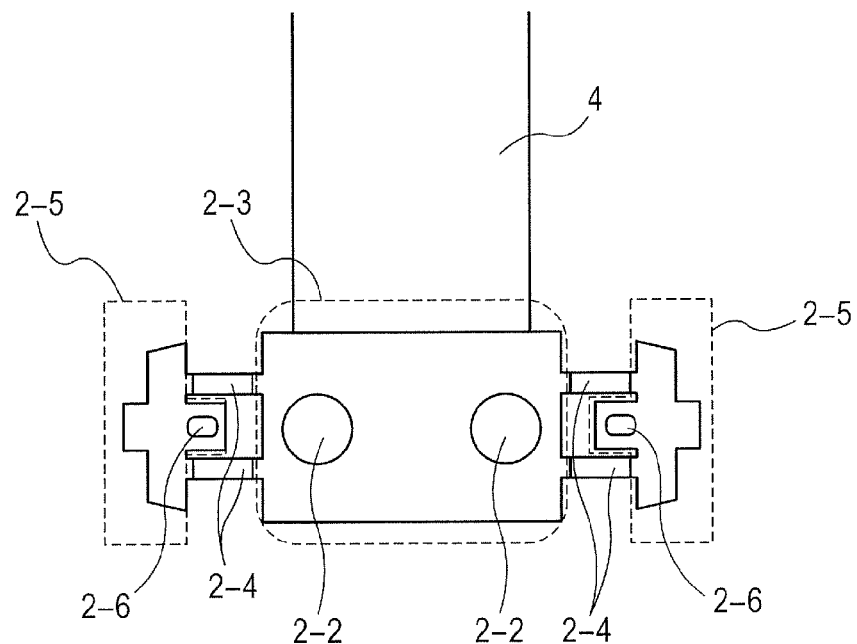
FIG. 1A is a top view of a configuration example of a flat-plate vibrator.
Figure 1B:
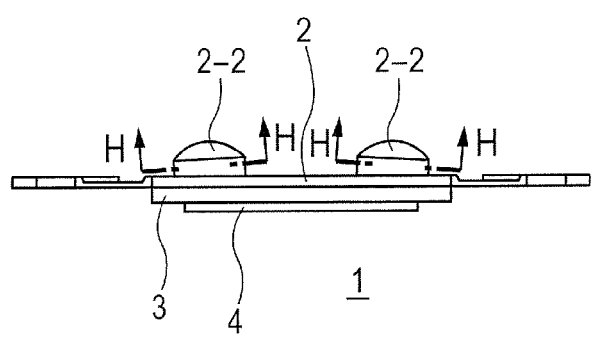
FIG. 1B is a front view of the configuration example of the flat-plate vibrator.

Specifically, as illustrated in FIGS. 1A and 1B, a flat-plate vibrator 1 includes: an elastic body 2; a piezoelectric element 3 as an example of the electrical-mechanical energy converting element; and a flexible printed circuit (FPC) 4 that supplies power to the piezoelectric element 3.

The piezoelectric element 3 is fixed to the elastic body 2 by adhesion, etc.

The elastic body 2 includes: a vibration part 2-3 that vibrates along with the piezoelectric element 3; supporting parts 2-5 substantially isolated from the vibration of the vibration part; and connection parts 2-4 that connect the vibration part 2-3 and the supporting parts 2-5, in which one end follows the vibration of the vibration part 2-3, and the other end functions not to transmit the vibration to the supporting part 2-5.

Long round holes 2-6 are formed on the supporting parts 2-5, and pins 8 described later (FIGS. 3 and 4) are fitted to the long round holes 2-6 in the longitudinal direction at a predetermined clearance.

Figure 2:
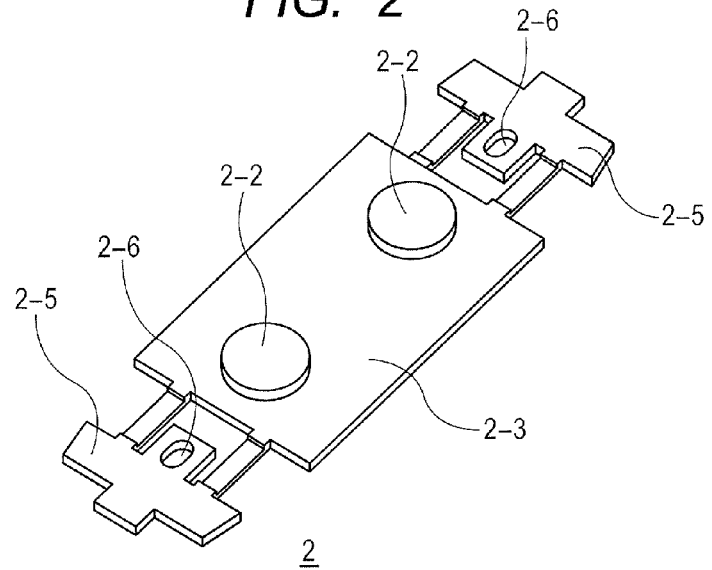
FIG. 2 is a diagram illustrating a configuration example of an elastic body of the plate vibrator.

The contact parts have spherical shapes convex toward the member to be driven. More specifically, the contact parts have convex shapes, and the shapes of the surfaces form part of the spherical shapes. Specifically, as shown in FIGS. 1A, 1B and 2, the vibration part 2-3 is provided with a plurality of projection parts 2-2 as frictional contact parts, on the other side of the fixed surface of the piezoelectric element 3. The present embodiment has a feature that the tip of the projection part 2-2 is shaped to form part of the sphere.

The shape of a cross section H-H perpendicular to the longitudinal axis of the projection part 2-2 is not limited to a circular shape, but can be other shapes such as a polygon that can be formed.

The elastic body 2 can be formed by any processing method, such as pressing, cutting, drawing and extrusion. An optimal processing method can be adopted according to the manufacturing cost and required accuracy.

Figure 3:
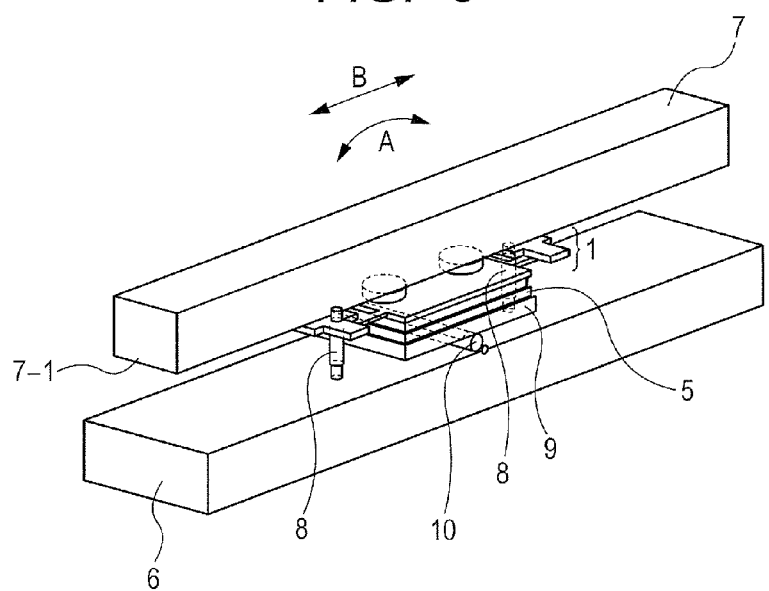
FIG. 3 is a diagram illustrating a configuration of main parts of a vibration type driving apparatus.
Figure 4:
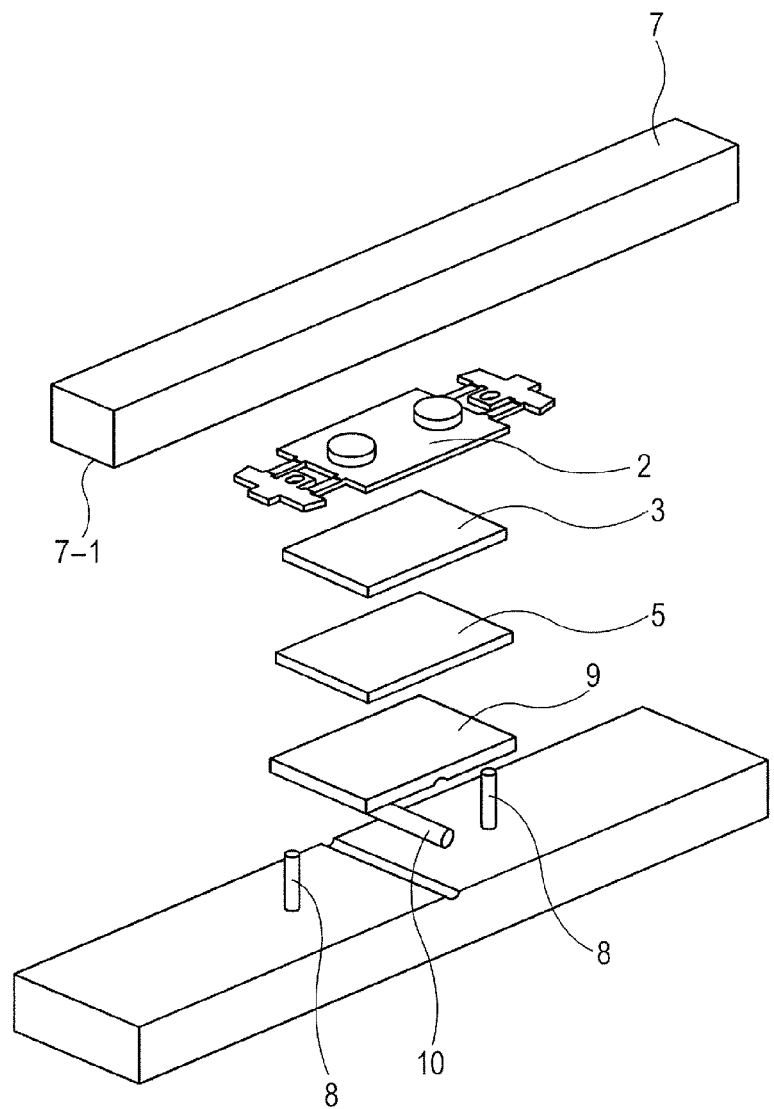
FIG. 4 is a diagram illustrating the configuration of FIG. 3 by exploding each component.

As illustrated in FIGS. 3 and 4, the flat-plate vibrator 1 is mounted on an equalize plate 9 across a felt 5, and the equalize plate 9 is supported by an attachment base member 6 across a cylindrical shaft 10. Therefore, the attachment base member 6 supports the vibrator 1. In the present embodiment, the equalize plate 9 and the cylindrical shaft 10 form an equalize member. The equalize member is arranged between the vibrator 1 and the attachment base member 6 and is a member for equalizing the load on the plurality of projection parts 2-2. In the present invention, the equalization of the load includes not only complete equalization of the load, but also substantial equalization of the load and reduction in variations of load distribution as a result of the arrangement of the equalize member.

In the present embodiment, the felt 5 is arranged between the equalize plate 9 and the vibrator 1 that form the equalize member. The felt 5 functions as a vibration isolating member for cutting off the transmission of vibration between vibrator 1 and the equalize plate 9. V grooves are formed on a lower surface of the equalize plate 9 and on an upper surface of the attachment base member 6, and the shaft 10 is fitted to the V grooves. In this way, the equalize plate 9 and the flat-plate vibrator 1 are equalized in an A direction of FIG. 3, and the movement of the equalize plate 9 in a B direction is restricted.

The pins 8 are set up on the attachment base member 6 and are fitted to the long round holes 2-6 of the elastic body 2 to restrict the movement of the flat-plate vibrator 1 in the B direction at a predetermined margin (play).

The margin can equalize the flat-plate vibrator 1 in the A direction. A slider (member to be driven) 7 includes, on a surface, a frictional contact part 7-1 applied with antiwear treatment. The frictional contact part 7-1 is arranged to face and come into contact with the frictional contact surface of the vibrator 1.

A spring element (not illustrated) provides appropriate pressurization force to the flat-plate vibrator 1 and the slider 7.

In the present embodiment, the tip of the projection part 2-2 is shaped to form part of the sphere.

Figure 5A:
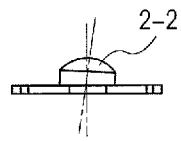
FIG. 5A is a left view of rising directions of elastic body projection parts of the plate vibrator.
Figure 5B:
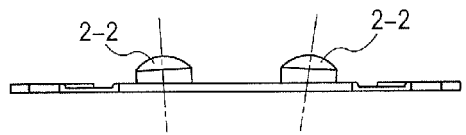
FIG. 5B is a front view of the rising directions of the elastic body projection parts of the plate vibrator.

Therefore, the plurality of projection parts 2-2 come into contact with the slider 7 at equal force, and the contact areas are the same, regardless of the rising directions of the projection parts 2-2 due to errors in manufacturing as illustrated in FIGS. 5A and 5B. In the present invention, the "same" denotes not only exactly the same, but also substantially the same.

Although the contact part of the sphere and the plane is geometrically a point, it should be noted that the contact part actually has some area due to the flexure of the material.

Figure 6:
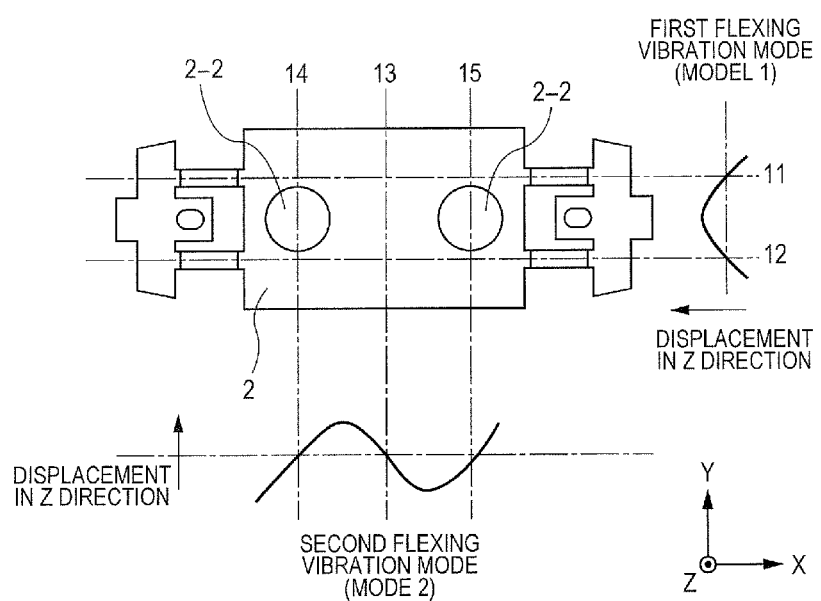
FIG. 6 is a diagram for describing vibration modes of the flat-plate vibrator.

When an AC electric field is applied from the FPC 4 to the piezoelectric element 3, a first vibration mode (mode 1) and a second vibration mode (mode 2) as illustrated in FIG. 6 are excited in the flat-plate vibrator 1.

The mode 1 is a primary out-of-plate flexing vibration mode in a lateral direction of the flat-plate vibrator 1, the mode including two nodal lines (linear parts as nodes of vibration) 11 and 12 in a direction orthogonal to the lateral direction in FIG. 6, in which center parts of the nodal lines 11 and 12 serve as antinodes of vibration.

Meanwhile, the mode 2 is a secondary out-of-plane flexing vibration mode in a longitudinal direction of the flat-plate vibrator 1, the mode including three nodal lines (13, 14 and 15) orthogonal to the two nodal lines 11 and 12 in FIG. 6.

As illustrated in FIG. 6, the projection parts 2-2 are set to substantially coincide with positions of nodal lines 14 and 15. Therefore, when the mode 2 is excited, vibration amplitude in a Z direction of the tips (upper surfaces) of the projection parts 2-2 is substantially zero, and only vibration amplitude in an X direction is generated.

When the mode 1 is excited, vibration amplitude of the projection parts 2-2 in the X direction is substantially zero, and vibration amplitude in the Z direction becomes the maximum.

Therefore, if these two vibration modes are excited at the same time to appropriately adjust and combine the phases of vibration, an elliptical motion is generated at the projection parts 2-2 formed on the elastic body 2.

As a result, if the slider 7 as illustrated in FIG. 3 comes into contact with the projection parts, the slider 7 is driven in the direction of the arrow B due to frictional force based on the elliptical motion.

According to the configuration, the tips of the elastic body projection parts as frictional contact parts in the vibration type driving apparatus are shaped to form part of the spheres. Therefore, the contact areas relative to the moving body are equalized in the motor without highly accurate processing of the projection parts, and deterioration in the motor characteristics can be prevented. An increase in the cost associated with highly accurate projection parts can also be prevented.

Second Embodiment

A configuration example of a manufacturing method of a vibrator in a vibration type driving apparatus will be described in a second embodiment with reference to FIGS. 7 to 11, 17 and 18.

The elastic body of the present embodiment is obtained by applying post-processing to the elastic body of the first embodiment to change the shape.

Figure 7:
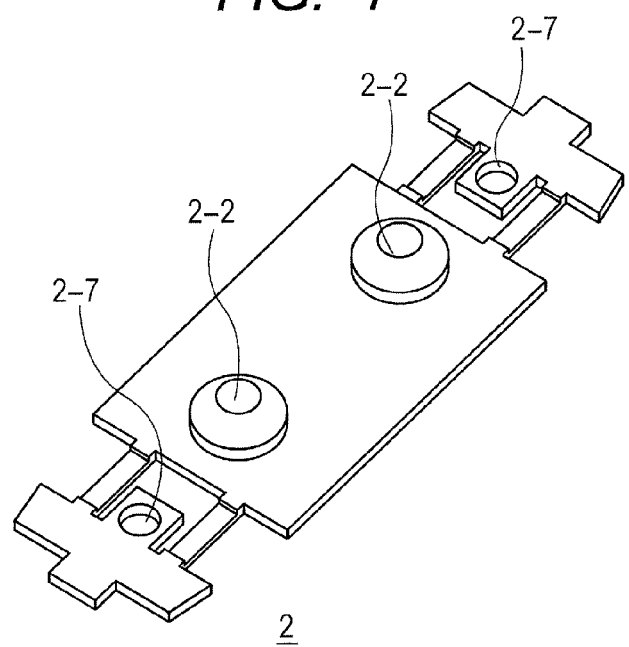
FIG. 7 is a diagram illustrating a configuration example of the elastic body of the plate vibrator.

In the present embodiment, the tips of the plurality of projection parts 2-2 (tip shapes form part of sphere) are processed by grinding or lapping processing for the arrangement on the same plane as illustrated in FIG. 7, and the shapes of the cut areas (surfaces exposed by cutting off part of the projection parts) are circular shapes with the same diameter. Therefore, the projection parts 2-2 have convex shapes, and part of the surface of the convex shape is removed in part of each spherical shape.

It is known that the antiwear property is improved by applying grinding or lapping processing to the projection parts 2-2 depending on the materials of the elastic body 2 and the slider 7 and depending on the state of the surface of the contact parts. The present embodiment is suitable for such a case.

In association with the tip shape of the projection parts 2-2, the equalize configuration of the flat-plate vibrator 1 is also different.

The foregoing two points are the differences from the first embodiment. In place of the long round holes 2-6, round holes 2-7 with a predetermined play (clearance) relative to the outside diameters of the pins 8 are formed on the elastic body 2, and this is associated with the equalize configuration (described later).

Figure 8:
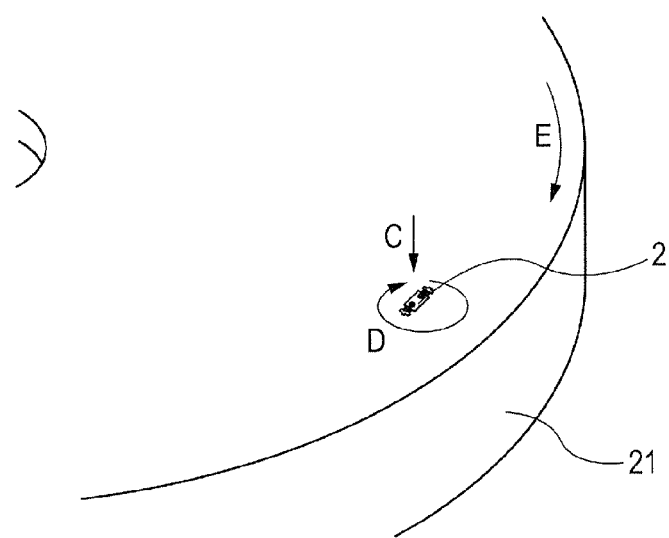
FIG. 8 is a diagram illustrating lapping or grinding processing of the elastic body in a manufacturing method of the vibration type driving apparatus.

In FIGS. 8, 9A and 9B, a lap disc or grinding disc 21 rotates in an E direction. The elastic body 2 is set so that the plane part is substantially parallel to the lap disc 21, the tips of the projection parts 2-2 come into contact with the lap disc 21, and equal load is imposed on the plurality of projection parts 2-2 in a C direction of FIG. 8.

To prevent inequality in the amount of cutting due to the difference in the peripheral length in the radial direction of the lap disc, a rotation mechanism (not illustrated) rotates the elastic body 2 in a D direction for the scraping.

As a result of the processing of the tips of the projection parts 2-2, the tips are on the same plane, and the tips have circular shapes with the same area as illustrated in FIGS. 9A and 9B, regardless of the rising directions of the projection parts 2-2 due to errors in manufacturing.

Figure 17:
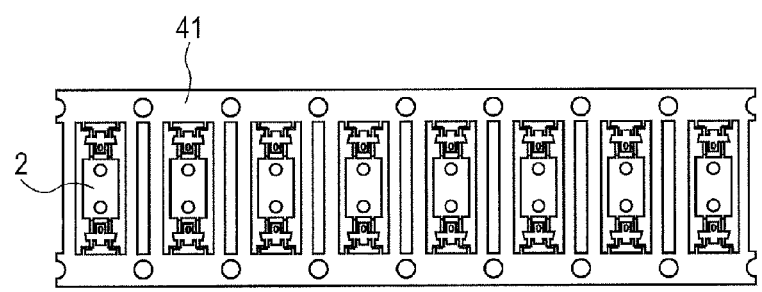
FIG. 17 is a diagram illustrating a sheet-shaped elastic body.
Figure 18:
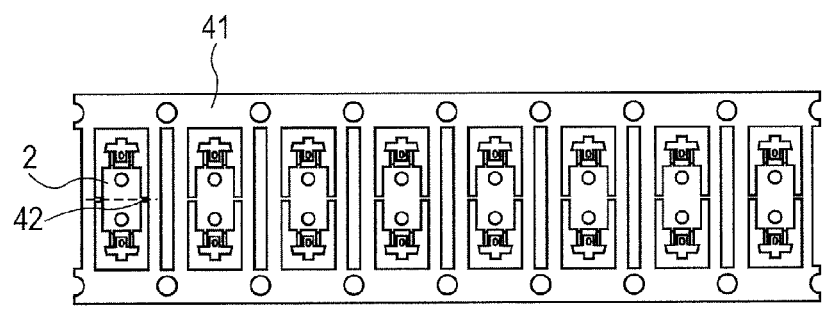
FIG. 18 is a diagram illustrating the sheet-shaped elastic body.
Figure 19:
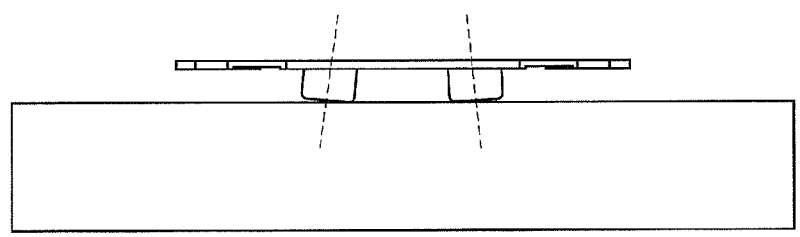
FIG. 19 is a diagram illustrating lapping or grinding processing of the elastic body.
Figure 20:
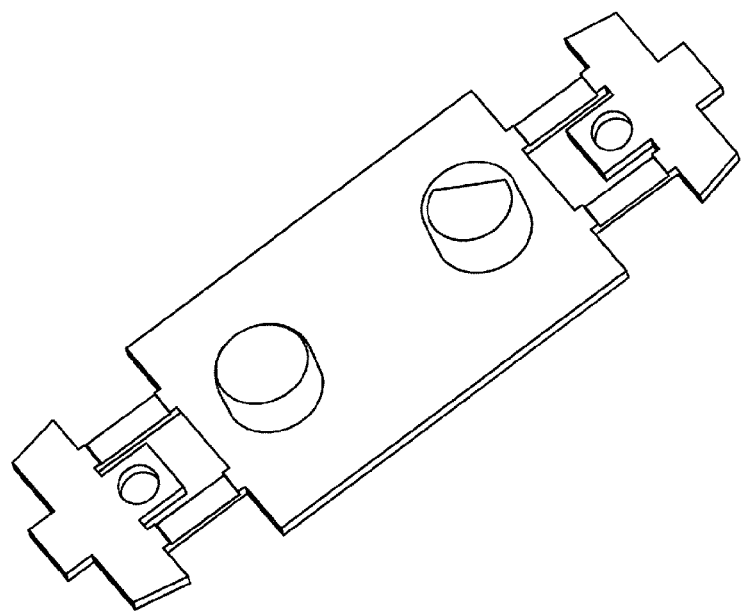
FIG. 20 is a diagram illustrating a state in the middle of the lapping or grinding processing of the elastic body.

If the elastic body 2 is manufactured by progressing-type pressing, a plurality of elastic bodies 2 are integrated and continuous in a sheet shape, forming a sheet-shaped member in the middle of the manufacturing process as illustrated in FIGS. 17 and 18. The lapping or grinding processing can also be applied in this format.

In this case, a connection part that connects the elastic bodies and a frame part is included. The connection part can have a configuration as illustrated in FIG. 18 for example, in which the connection part is on one axis in a substantially perpendicular direction of the arrangement of the contact parts.

The format of FIG. 17 is developed in FIG. 18. A connection part 42 of the elastic body 2 and the frame part 41 is formed to coincide with a perpendicular bisector of a line connecting the projection parts 2-2 and to have proper torsional rigidity.

As a result, when load in the C direction is imposed on the elastic body 2 during lapping, the connection part 42 serves as a rotation center axis. The elastic body 2 easily follows the lap disc 21, and equal load can be more easily imposed on a plurality of projection parts 2-2 in one elastic body 2.

In this way, the lapping or grinding processing in the sheet form can eliminate the process of aligning and arranging single elastic bodies 2 on the lap disc 21.

Figure 11:
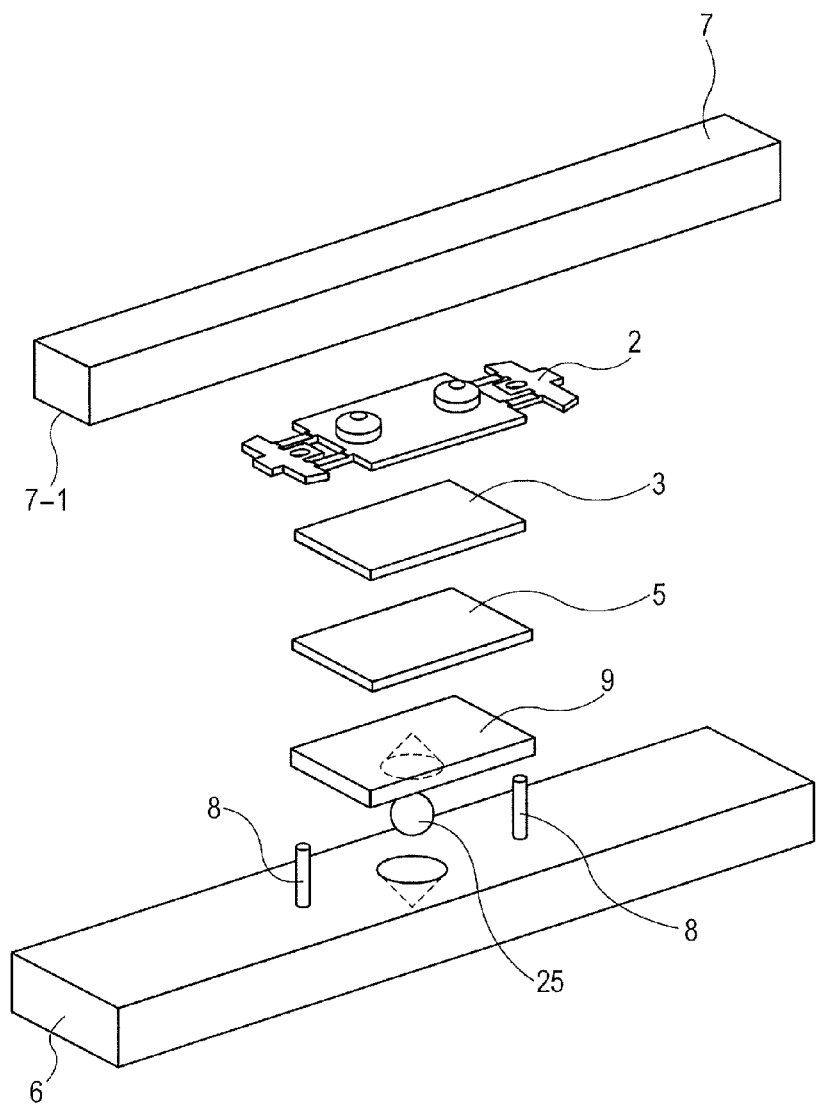
FIG. 11 is a diagram illustrating the configuration of FIG. 10 by exploding each component.

As illustrated in FIGS. 10 and 11, the flat-plate vibrator 1 is mounted on the equalize plate 9 across the felt 5, and the equalize plate 9 is supported by the attachment base member 6 across the sphere 25.

Conical grooves are formed on the lower surface of the equalize plate 9 and on the upper surface of the attachment base member 6, and the sphere 25 is fitted to the conical grooves. In this way, the equalize plate 9 and the flat-plate vibrator 1 are equalized in an F direction of FIG. 10, and movement of the equalize plate 9 in the B direction is restricted.

Although the F direction is expressed by two arrows with a 90° difference in the orientation, the F direction denotes the entire direction obtained by rotating one arrow 360° around the vertical axis.

The pins 8 are fitted to the round holes 2-7 of the elastic body 2, and the movement of the flat-plate vibrator 1 in the B direction is restricted at a predetermined margin (play).

The margin can equalize the flat-plate vibrator 1 in the F direction. The slider 7 includes, on a surface, the frictional contact part 7-1 applied with antiwear treatment. The frictional contact part 7-1 is arranged to face and come into contact with the frictional contact surface of the vibrator 1.

A spring element (not illustrated) provides appropriate pressurization force to the flat-plate vibrator 1 and the slider 7.

As a result, all tips of the projection parts 2-2 follow the frictional contact part 7-1, and equal contact area and equal welding pressure are secured at the contact parts.

In this way, the tips of the plurality of projection parts 2-2 are on the same plane and have circular shapes with the same area in the present embodiment.

Therefore, the plurality of projection parts 2-2 come into contact with the slider 7 by equal force and have the same contact area, regardless of the rising directions of the projection parts 2-2 due to errors in manufacturing.

As a result, the contact areas relative to the moving body are equalized in the motor, and the deterioration in the motor characteristics can be prevented without highly accurate processing of the projection parts.

An increase in the cost associated with highly accurate projection parts can also be prevented.

Third Embodiment

A configuration example of a manufacturing method of a vibrator in a vibration type driving apparatus in a form different from the second embodiment will be described in a third embodiment with reference to FIGS. 12 to 16.

Figure 12:
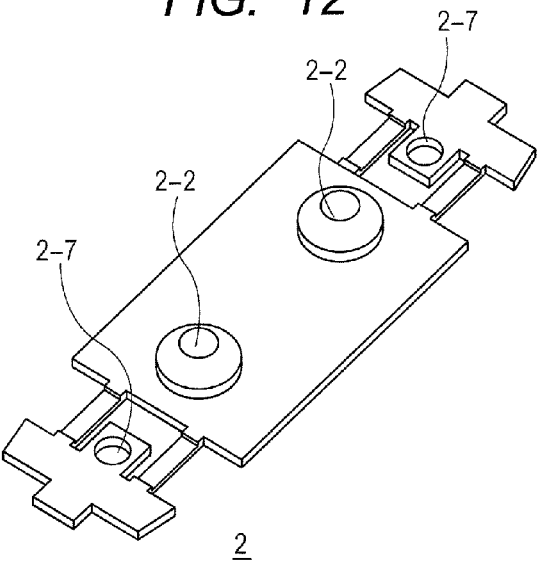
FIG. 12 is a diagram illustrating a configuration example of the elastic body of the plate vibrator.

FIG. 12 illustrates an elastic body according to the present embodiment. As in the second embodiment, the tips of the projection parts 2-2 are part of the spheres, and lapping or grinding processing is applied to the tips to form circular cut areas with the same diameter. A further restriction in the direction of the plane of the cut area is added to the second embodiment. Therefore, the manufacturing process is also different.

Figure 13:
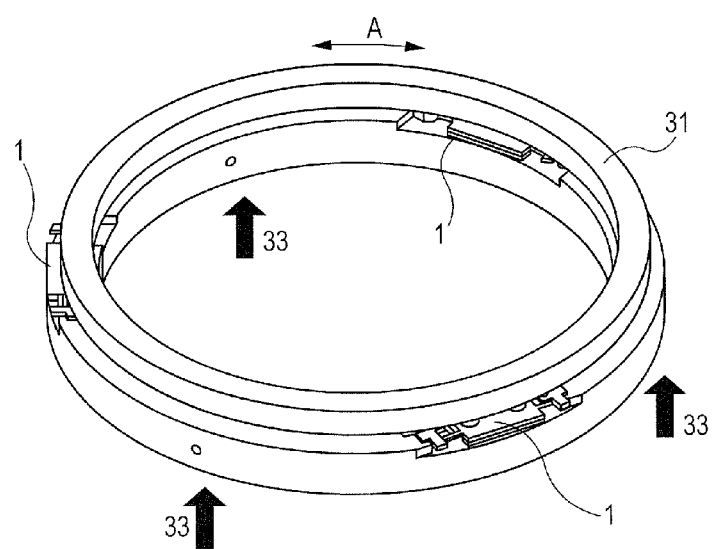
FIG. 13 is a diagram illustrating a configuration of main parts of the vibration type driving apparatus.

FIG. 13 is a configuration diagram of a vibration type driving apparatus of a type in which a plurality of vibrators 1 are arranged on the same circumference, and a moving body 31 in an annular shape is moved in the A direction of FIG. 13.

To attain excellent motor characteristics in the vibration type driving apparatus in this format, all contact parts (circular cut areas of the projection parts 2-2) of all vibrators 1 that are in contact with the moving body 31 need to highly accurately exist on one plane. The present embodiment is suitable for such a vibration type driving apparatus in which a plurality of vibrators drives a moving body.

Figure 14:
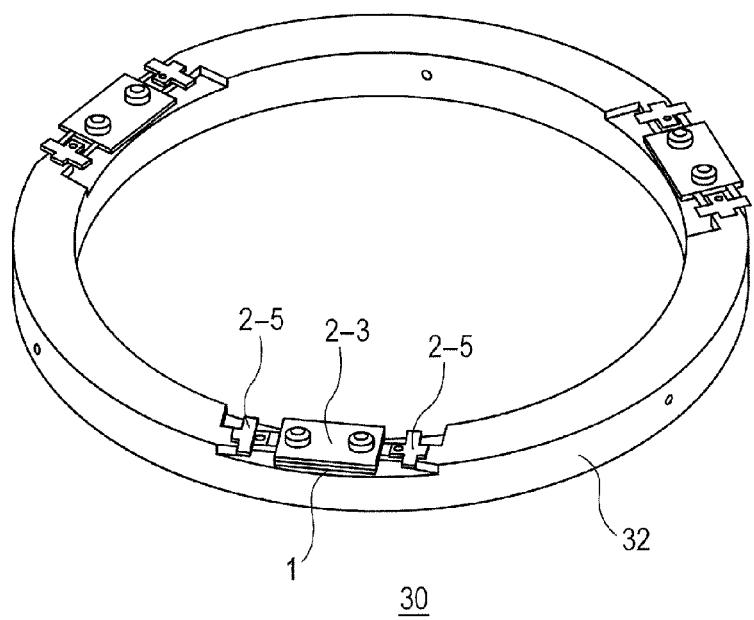
FIG. 14 is a diagram illustrating a stator portion of the vibration type driving apparatus.

FIG. 14 illustrates a stator portion 30 of the vibration type driving apparatus of FIG. 13. The same number of concave step parts as the vibrators 1 are formed on an upper surface of an attachment base member 32 in an annular shape, and the vibrators 1 are sunk and placed in the step parts.

The upper surface of the attachment base member 32 and the lower surface of the supporting part 2-5 of the elastic body 2 are fixed by a method, such as adhesion and welding. The lowest surface (FPC 4: not illustrated) of the vibrator 1 is not in contact with the attachment base member 32 to avoid inhibiting the vibration of the vibration part 2-3.

Figure 15:
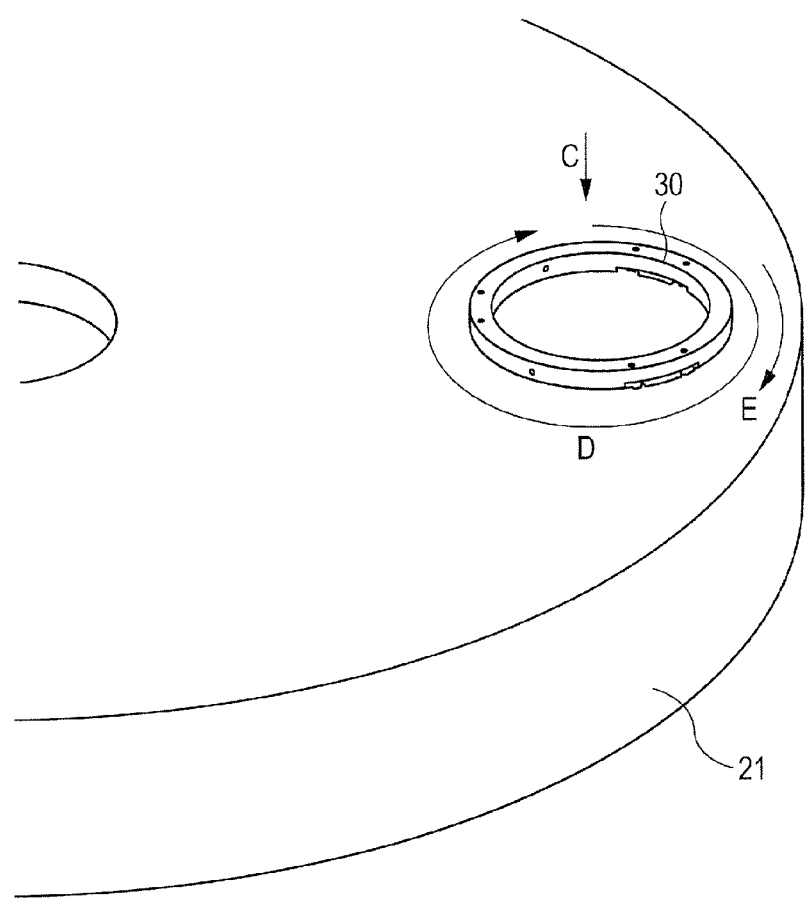
FIG. 15 is a diagram illustrating lapping or grinding processing of the elastic body.

The feature here is that elastic bodies of a plurality of vibrators are attached to a common base member. In other words, lapping or grinding processing is applied to the tips of the projection parts 2-2, while the stator portion 30 is attached. FIG. 15 illustrates this.

In FIG. 15, the lap disc or grinding disc 21 rotates in the E direction.

The stator portion 30 is set so that the tips of all projection parts 2-2 come into contact with the lap disc 21, and equal load is imposed on the plurality of projection parts 2-2 in the C direction of FIG. 8.

Geometrically, the lapping or grinding processing is started, while only three of the projection parts 2-2 (six in FIG. 15) come into contact with the lap disc 21.

All projection parts come into touch with the lap disc 21 after progress in the lapping or grinding process, and there is inequality in the sizes of the circular shapes of the cut areas.

However, based on the flexure of the constituent member of the stator portion 30, all projection parts 2-2 are actually pressed against the lap disc 21 at substantially equal load when the load in the C direction is imposed around the center of the stator portion 30.

Therefore, there is no inequality in the sizes of the circular shapes of the cut areas that poses a problem in the motor characteristics.

To prevent inequality in the amount of cutting due to the difference in the peripheral length in the radial direction of the lap disc, a rotation mechanism (not illustrated) rotates the stator portion 30 in the D direction for the scraping.

Figure 16:
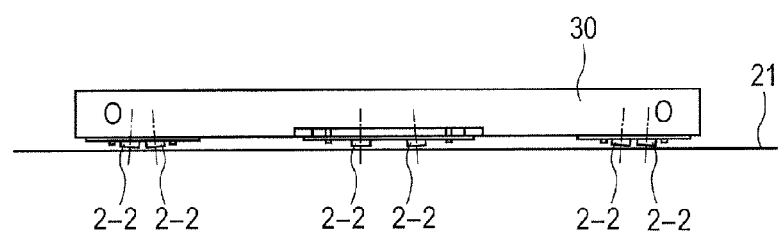
FIG. 16 is an exploded view of the elastic body of FIG. 15.

As a result of the processing of the tips of the projection parts 2-2, the tips are on the same plane, and the tips have circular shapes with the same area, regardless of the rising directions of the projection parts 2-2 due to errors in manufacturing as illustrated in FIG. 16.

Although the elastic body 2 includes a plurality of projection parts 2-2 in the description of the present embodiment, the nature of the present invention is not lost even if the number of projection parts 2-2 is one.

A configuration of the vibration type driving apparatus according to the present embodiment will be described with reference again to FIG. 13.

Biasing force 33 of at least three compression springs pressurizes the stator portion 30 against the moving body 31 at an appropriate pressure.

According to the configuration, all frictional contact parts (projection parts 2-2) on the stator portion 30 follow the moving body 31, at the same contact area and equal pressurization force relative to the lower surface of the moving body 31.

As described, the tips of the elastic body projection parts as frictional contact parts are formed by part of the spheres in the vibration type driving apparatus including a plurality of vibrators, and the lapping or grinding processing is performed while the projection parts are attached to the stator.

As a result, the contact areas relative to the moving body are equalized in the motor, and the deterioration in the motor characteristics can be prevented, without highly accurately processing the projection parts. The increase in the cost associated with highly accurate projection parts can also be prevented.

According to an aspect of the present invention, a vibrator, a vibration type driving apparatus and a manufacturing method of the vibrator that can improve driving performance by equalizing contact areas relative to a moving body can be realized, without the necessity to highly accurately process projection parts in the vibrator.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-095705, filed on Apr. 19, 2012, which is hereby incorporated by reference herein in its entirety.

What is claimed is:

1. A vibrator comprising:
an electrical-mechanical energy converting element; and
an elastic body bonded to the electrical-mechanical energy converting element and comprising at least two contact parts,
wherein the at least two contact parts have convex shapes,
wherein shapes of surfaces of the at least two contact parts are part of spherical shapes, and
wherein rising directions of the at least two contact parts toward a member to be driven when the member is driven are different.

2. The vibrator according to claim 1, wherein
in the vibrator, the at least two contact parts come into frictional contact with the member to be driven, and vibration generated by the elastic body effects relative movement between the member to be driven and the vibrator.

3. The vibrator according to claim 1, wherein
each of the shapes of the surfaces of the at least two contact parts is a shape in which part of a spherical shape has been removed.

4. The vibrator according to claim 3, wherein
surfaces of the at least two contact parts from which the parts of the spherical shape have been removed have a same area.

5. A vibration type driving apparatus comprising:
the vibrator according to claim 1;
an attachment base member that supports the vibrator; and
an equalizer arranged between the vibrator and the attachment base member.

6. The vibration type driving apparatus according to claim 5, wherein
the equalizer has a function of equalizing load on the at least two contact parts.

7. The vibration type driving apparatus according to claim 5, further comprising
a vibration isolating member arranged between the equalizer and the vibrator.

8. A vibration type driving apparatus comprising a plurality of vibrators according to claim 1.

* * * * *